(12) United States Patent
Beato et al.

(10) Patent No.: US 10,348,054 B2
(45) Date of Patent: Jul. 9, 2019

(54) OPTICAL MEASUREMENT SYSTEM WITH STABILISED DAVLL CONTROL

(71) Applicant: COMMISSARIAT A L'ENERGIE ATOMIQUE ET AUX ENERGIES ALTERNATIVES, Paris (FR)

(72) Inventors: Francois Beato, Fontaine (FR); Agustin Palacios Laloy, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/121,143

(22) Filed: Sep. 4, 2018

(65) Prior Publication Data
US 2019/0074660 A1 Mar. 7, 2019

(30) Foreign Application Priority Data

Sep. 6, 2017 (FR) ...................... 17 58217

(51) Int. Cl.
H01S 5/06 (2006.01)
H01S 5/0687 (2006.01)
H01S 5/024 (2006.01)
G01R 33/26 (2006.01)

(52) U.S. Cl.
CPC ........ *H01S 5/0687* (2013.01); *H01S 5/02415* (2013.01); *G01R 33/26* (2013.01)

(58) Field of Classification Search
CPC ........ H01S 5/0687; H01S 5/0215; H01S 5/10; H01S 5/10053; H01S 5/10061; H01S 5/13; H01S 5/1392; G01R 33/26
See application file for complete search history.

(56) References Cited

U.S. PATENT DOCUMENTS 6,009,111 A * 12/1999 Corwin ................. H01S 5/0687
372/102

OTHER PUBLICATIONS

French Preliminary Search Report dated Apr. 23, 2018 in French Application 17 58217 filed on Sep. 6, 2017 (with English Translation of Categories of cited documents).
Corwin, K. et al. "Frequency-stabilized diode laser with the Zeeman shift in an atomic vapor" Applied Optics, Optical Society of America, vol. 37, No. 15, 1998, pp. 4.

(Continued)

*Primary Examiner* — Armando Rodriguez
(74) *Attorney, Agent, or Firm* — Oblon, McClelland, Maier & Neustadt, L.L.P.

(57) ABSTRACT

The invention relates to the controlling of the wavelength of a laser (2) on an atomic transition. It in particular proposes a method comprising the steps consisting in:
  emitting a laser beam in the direction of a cell (3) filled with an atomic vapour;
  carrying out a supply of energy to the atoms of the atomic vapour using a source of energy (4);
  generating a DAVLL signal ($S_{DAVLL}$) using the laser beam that has passed through the cell (3); and
  controlling the wavelength of the laser using the DAVLL signal.
According to the invention, the supplying of energy to the atoms of the atomic vapour is modulated to carry out the alternating of a first phase and of a second phase, the first phase supplying more energy than the second phase.

15 Claims, 1 Drawing Sheet

(56) References Cited

OTHER PUBLICATIONS

Pustelny, S. et al "Dichroic atomic vapor laser lock with multi-gigahertz stabilization range", arXiv.org, Jul. 2016, pp. 11.
Reeves, J. "Temperature stability of a dichroic atomic vapor laser lock," Applied Optics, vol. 45, No. 2, 2006, pp. 5.
Shah, V. et al. "A Miniature Cold-Atom Frequency Standard," URL:https://arxiv.org/ftp/arxiv/papers/1111/1111.5890.pdf, 2011, pp. 5.
Shah, V. et al. "A Miniature Cold Atom frequency Standard" Proceedings of the 43rd annual precise time and time interval(PTTI) systems and applications meeting, the Institute of navigation, 2011, pp. 10.
Cheron,B. et al. "Laser frequency stabilization using Zeeman effect," Journa de Physique III, EDP Sciences, https://hal.archives-ouvertes.fr/jpa-00249111, 1994, pp. 7.

* cited by examiner

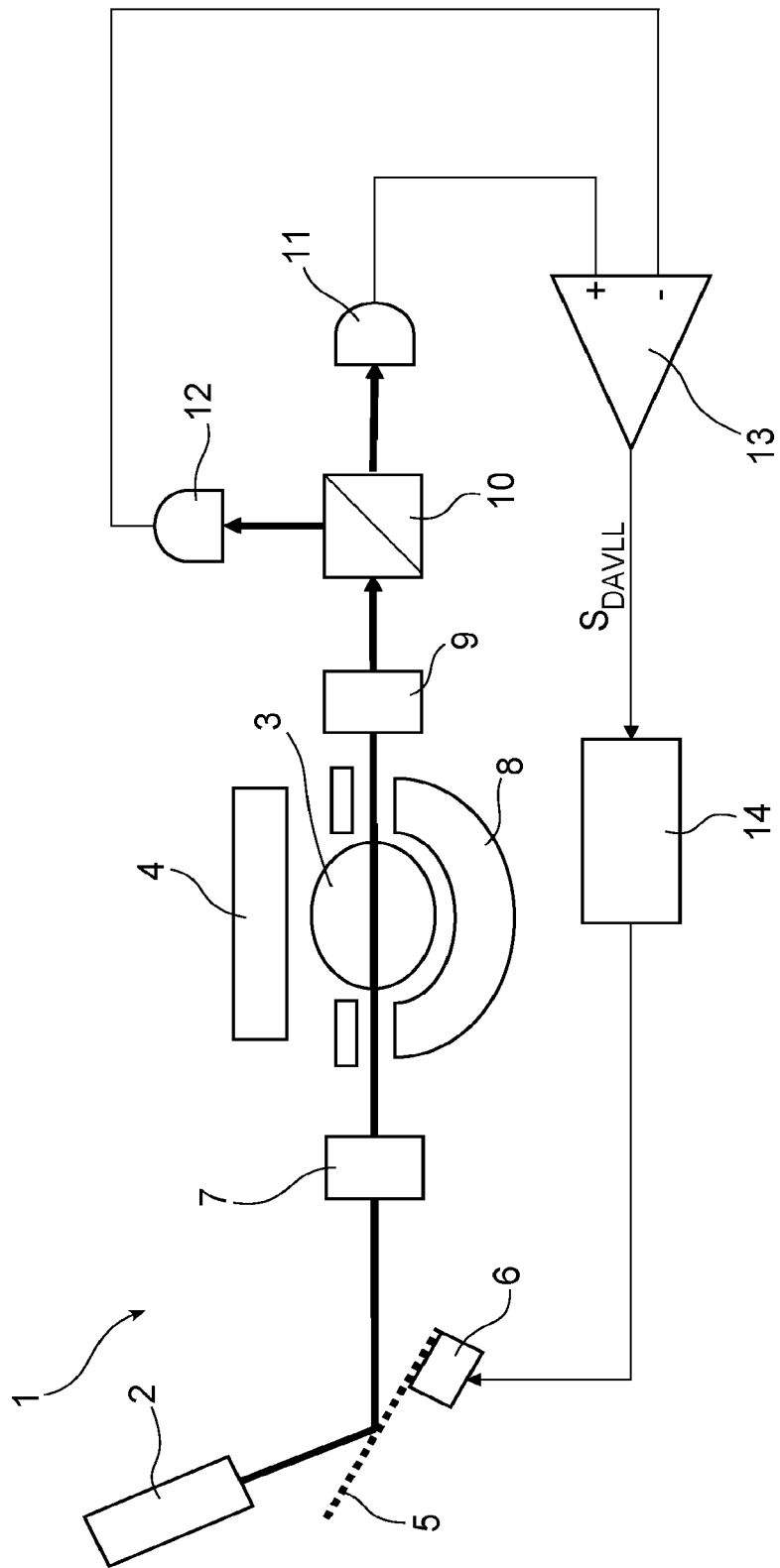

OPTICAL MEASUREMENT SYSTEM WITH STABILISED DAVLL CONTROL

TECHNICAL FIELD

The field of the invention is that of controlling the wavelength of the light emitted by a laser on an atomic transition. The invention more particularly relates to a so-called DAVLL control (for Dichroic Atomic Vapour Laser Lock) which carries out a separation via Zeeman shift of polarisation components of a laser beam and generates an error signal which corresponds to the difference of the rates of absorption of these polarisation components in an atomic vapour.

PRIOR ART

Atomic sensors use a set of atoms with low interaction with one another as a sensitive element for measuring and/or following various physical magnitudes (time, magnetic field, acceleration for example) with high sensitivity and/or high accuracy.

These sensors can be divided into two major families. There are as such on the one hand sensors that make use of an atomic gas that is heated or thermalised with the environment (which entails substantial diffusion speeds, typically of about 10 to 1,000 m/s), often called hot atom sensors or optical pumping sensors. And there are on the other hand sensors that implement laser cooling and trapping techniques in order to overcome the thermal and displacement effects of the atoms. The atoms are as such confined in a measurement volume wherein the state of each atom can be controlled and measured individually. These sensors are referred to as cold atom sensors.

Also note that certain systems, such as nitrogen-vacancy centres in diamond, which although they are in solid state have an energy spectrum that is close to atoms of an atomic gas and have similar behaviours. These systems are as such often included in the field of atomic sensors.

The accuracy of these atomic sensors is based on the invariability of the properties of atoms: all of the atoms of a chemical species are effectively perfectly equivalent amongst themselves, and have properties that can be calculated and that do not vary over time. This makes it possible in particular to overcome derivatives that appear on other sensors, such as mechanical or electrical sensors made from semiconductors which are subject to ageing which inevitably causes their behaviour to vary over time.

As such, among the atomic sensors are clocks that achieve excellent levels of accuracy (atomic clocks), but also magnetometers, gyroscopes, accelerometers and atomic gravimeters that allow for very precise measurements respectively of the magnetic field, rotation, acceleration and of the gravitational field. In other sensors that aim for sensitivity rather than accuracy, the benefit obtained comes from the low interaction between the different atoms: this is in particular the case for low-noise magnetometers based on non-cooled atoms.

Most of these sensors implement sources of light of the laser type. These sources of light are characterised in particular by high spectral finesse, as the light is emitted only in a very narrow wavelength range around a central value (the standard deviation being of about a few tens of MHz, but able to reach a Hz on some lasers). This spectral finesse is important in order to make it possible to be in tune in a controlled manner with the different atomic transitions required to prepare the atoms for measurement or for obtaining information of the state of the atoms. For this same purpose, it is important that the light be in tune very precisely with the desired wavelength without there being a systematic shift or a deviation between the position of the laser line and the atomic transition or transitions used.

It is therefore generally sought to control the control parameters of the laser in such a way that they are stable at a fixed wavelength in relation to a given atomic transition. The objective is that the difference between the central wavelength of the light emitted by the laser and that of the target atomic transition be less than values that could induce undesirable effects, such as losses of signal, the absence of laser cooling, light shifts (effect known as "AC-Stark shift" consisting in that light that is circularly polarised and not tuned to an atomic transition behaves like a fictive magnetic field that disturbs the behaviour of the atoms) or other similar effects that introduce significant faults into the operation of an atomic sensor.

Different techniques for controlling a laser at an atomic transition have been proposed. A technique is known in consisting in carrying out a modulation of the wavelength of the laser around a target atomic transition and in carrying out the controlling of its zero odd symmetry (technique known in literature as "dither lock"). This technique however has the disadvantage of not being very sensitive to differences in wavelength and of requiring a modulation of the laser. However this modulation is penalising. Indeed, even if the central wavelength of the laser is indeed fixed on the atomic transition, the modulation induces a spectral spread over a range of locking of the controlling. This range of locking is moreover at most about the width of the atomic line used as a reference, and cannot be much less than the latter.

An improvement making it possible to increase the sensitivity of the controlling is based on saturated absorption techniques (also known as "Doppler-free spectroscopy") which make it possible to access the atomic line by casting aside the enlargements coming from the thermal speed of the atoms.

It is moreover known, for example from documents [1] and [2] mentioned at the end of the description, a technique for controlling which avoids any modulation of the laser. This principle of controlling is based on the dichroism of an atomic vapour subjected to a substantial magnetic field (of about 1-1000 mT). This technique is known in literature as DAVLL ("Dichroic Atomic Vapour Laser Lock").

This technique DAVLL uses a magnet to separate the lines corresponding to the circular polarisations σ+ and σ− by a shift greater than the width of the optical line of the target atomic transition (with this width being set either by Doppler enlargement or by its enlargement in pressure). The atomic gas as such acquires a circular dichroism that cancels out very precisely for the wavelength that corresponds to the atomic transition. This dichroism is measured by a polarimetric optical assembly consisting in a quarter wave plate that converts the circular polarisations σ+ and σ− into linear polarisations, a beam separator that separates the linear polarisations and two photodiodes that each receive one of the linear polarisations. The currents of these photodiodes are proportional to the intensities of the left and right circular polarisations at the output of the atomic gas cell. These currents are transformed into voltages by transimpedance amplifiers. The difference in these voltages forms a DAVLL signal. The controlling of the DAVLL signal on a zero allows for a calibrating of the laser on the centre of the atomic transition, in particular by providing a setpoint voltage to a piezoelectric transducer that controls the orientation of an output mirror of the laser for a cavity surface laser, or by providing a current setpoint to a Peltier module that controls the temperature of the diode for the case of a semiconductor laser.

It has been observed that the thermal stability of the polarimetric optical assemblies required for generating a DAVLL signal is critical for the stability of the controlling. Document [3] mentioned at the end of the description shows in this respect the difficulties that can appear when the polarimetric assembly is sensitive to the temperature.

Using optical elements with high thermal stability makes it possible to resolve this problem partially, but makes the polarimetric assembly expensive and excludes the use of elements based on polarising polymer films. Document [3] proposes settings for the optical assembly that depend on the control point, which makes it possible to be sensitive only to the second order of the variations in temperature. But this latter solution requires complex adjustments and does not entirely solve the problem.

DISCLOSURE OF THE INVENTION

The invention has for objective to improve the stability, in particular thermal stability, of a DAVLL control by means of a technique that is simple to implement and inexpensive.

To this effect, it proposes a method for controlling the wavelength of a laser on an atomic transition, comprising the steps consisting in:
  emitting a laser beam towards a cell filled with an atomic vapour;
  carrying out a supply of energy to the atoms of the atomic vapour using a source of energy;
  generating a DAVLL signal using the laser beam that has passed through the cell; and
  controlling the wavelength of the laser using the DAVLL signal.

The supplying of energy to the atoms of the atomic vapour is modulated to carry out the alternating of a first phase and of a second phase, the first phase supplying more energy than the second phase.

Certain preferred but not limiting aspects of this method are the following:
  the supplying of energy of the first phase has an intensity such that the atoms are brought in an energised state wherein they are able to undergo said atomic transition when they are illuminated by the laser beam;
  the supplying of energy of the second phase has a zero intensity;
  the step consisting in generating a DAVLL signal using the laser beam that has passed through the cell comprises the operations consisting in:
    polarising the laser beam in order to create a combination of two polarisations of a first type;
    separating the two polarisations of the first type by means of a source of dichroism;
    converting the two polarisations of the first type at the output of the cell into two polarisations of a second type;
    separating the two polarisations of the second type into two beams;
    photodetecting the two separated beams, converting the photodetected beams into corresponding voltages and measuring the difference of said voltages;
  the measuring of the difference of said voltages comprises the calculation of the following standardised imbalance:

$$\frac{\frac{V_{1,Ph1} - V_{1,Ph2}}{V_{1,Ph2}} - \frac{V_{2,Ph1} - V_{2,Ph2}}{V_{2,Ph2}}}{\frac{V_{1,Ph1} - V_{1,Ph2}}{V_{1,Ph2}} + \frac{V_{2,Ph1} - V_{2,Ph2}}{V_{2,Ph2}}}$$

wherein:
  $V_{1,Ph1}$ represents the voltage measured by a first photodetector during the first phase of the supplying of energy;
  $V_{1,Ph2}$ represents the voltage measured by the first photodetector during the second phase of the supplying of energy;
  $V_{2,Ph1}$ represents the voltage measured by a second photodetector during the first phase of the supplying of energy; and
  $V_{2,Ph2}$ represents the voltage measured by the second photodetector during the second phase of the supplying of energy;
  the source of dichroism is a source of magnetic field;
  the source of magnetic field comprises one or several magnets arranged around the cell;
  the source of magnetic field comprises a coil arranged around the cell, said coil being passed through by a constant current;
  the source of magnetic field is a fictive magnetic field induced by an AC-Stark shift;
  the supplying of energy to the atoms of the atomic vapour is modulated to include a third phase in sequence with the first and second phases, the intensity of the supplying of energy of the third phase being identical to the intensity of the supplying of energy of the first phase and the source of magnetic field being interrupted during the third phase;
  the source of energy is a source of HF discharge or a source of thermal energy.
  The invention also relates to an optical measuring system, comprising:
  a cell filled with an atomic vapour and arranged to receive a laser beam emitted by a laser;
  a source of energy for carrying out a supply of energy to the atoms of the atomic vapour, the source of energy being configured to carry out the alternating of a first phase and of a second phase, the first phase supplying more energy than the second phase;
  a polarimetric optical assembly configured for generating a DAVLL signal using the laser beam that has passed through the cell; and
  a circuit for controlling the wavelength of the laser on an atomic transition using the DAVLL signal.

BRIEF DESCRIPTION OF THE DRAWINGS

Other aspects, purposes, advantages and characteristics shall appear better when reading the following detailed description of preferred embodiments of the latter, given by way of a non-limiting example, and in reference to the accompanying FIG. 1 which shows a diagram of an optical measuring system according to a possible embodiment of the invention.

DETAILED DESCRIPTION OF PARTICULAR EMBODIMENTS

The invention relates to a DAVLL method and a system for controlling the (central) wavelength of a laser on an atomic transition. In reference to FIG. 1, the laser 2 is provided on an optical measuring system which comprises a cell 3 filled with an atomic vapour, said cell 3 being arranged to receive a laser beam emitted by the laser towards the cell, and a source of energy 4 for carrying out a supply of energy to the atoms of the atomic vapour.

The laser 2 can include an output mirror 5 mounted on a piezoelectric transducer 6 able to control the position and/or the orientation thereof according to a setpoint voltage supplied to said transducer 6. The laser 2 can alternatively include a Peltier module able to control the temperature of a diode according to a current setpoint.

The source of energy 4 is in charge of bringing the atoms of the atomic vapour in an energised state wherein they are able to undergo said atomic transition when they are illuminated by the laser beam. In other terms, in the energised state, the atoms of the atomic vapour affect the properties of laser light passing through the cell 3 in a manner that is sufficiently intense so that the modifications of these properties can be measured.

The source of energy 4 can be a source of HF discharge (in the case with helium for example) or a source of thermal energy (in the case of alkaline metals for example, in order to provide a sufficient density in the gaseous phase). Taking the example of a cell filled with helium, the target atomic transition corresponds for example to the line $D_0$ (i.e. a central wavelength at 1083.205 nm) and the source of energy 4 is in charge of bringing the atoms of helium in the metastable state $2^3S_1$. The source of energy is typically a source of HF discharge that brings the atoms of helium in a metastable state by creating a radiative plasma and cascade.

The system for controlling the laser 1 comprises a polarimetric optical assembly 7-13 configured for generating a DAVLL signal $S_{DAVLL}$ using the laser beam that has passed through the cell and a circuit for controlling 14 the wavelength of the laser using the DAVLL signal $S_{DAVLL}$.

In a manner known per se, the polarimetric optical assembly comprises upstream of the cell 3 a polarizer 7 which receives the laser beam and creates a polarisation which is a combination of two polarisations of a first type sensitive to the dichroism of the atoms. The polarizer 7 is as such a linear polarizer that creates a combination of two circular polarisations when the atoms have a circular dichroism (this is the case with helium in particular). The polarizer 7 is a circular polarizer that creates a combination of two linear polarisations when the atoms have a linear dichroism.

The polarimetric optical assembly moreover comprises a source of dichroism 8 surrounding the cell 3 in order to separate the two polarisations of the first type. The source of dichroism 8 is for example a source of magnetic field. The source of magnetic field can comprise one or several magnets arranged around the cell.

In a first alternative, the source of magnetic field can comprise a coil arranged around the cell, said coil being passed through by a constant current.

In a second alternative, the source of magnetic field is a source of fictive magnetic field induced by the light shifts of the laser beam that are not in tune with the target atomic transition (effect known as "light-shift" or "AC-Stark shift"). To this effect, another laser beam can be used that propagates perpendicularly to the laser beam used to obtain the DAVLL signal. This other laser beam is voluntarily offset in frequency with respect to the transition of interest ($D_0$ for example) which induces in the system a fictive magnetic field, and induces the same properties of dichroism as hereinabove.

The polarimetric optical assembly further comprises, downstream of the cell 3, a polarisation converter 9, typically a quarter wave plate, for converting the two polarisations of the first type at the output of the cell into two polarisations of a second type, and a beam separator 10 for separating the two polarisations of the second type into two beams. Taking the example of a polarizer 7 of the linear type, the polarisation converter 9 converts the two circular polarisations into two linear polarisations, and the separator 10 separates the two linear polarisations into two beams. Each one of these beams is directed towards a photodetector 11, 12. Each photodetector 11, 12 converts the photodetected beam into a corresponding voltage. The voltages delivered by the photodetectors 11, 12 are subtracted from one another by a calculator 13, as such supplying the DAVLL signal which serves as an error signal for the controlling of the wavelength of the laser. In a possible embodiment, the calculator performs the calculation of a standardised imbalance by calculating the ratio of the difference of the voltages delivered by the photodetectors 11, 12 by the sum of said voltages.

As such, the step consisting in generating a DAVLL signal using the laser beam that has passed through the cell comprises the operations consisting in:
polarising, using the polarizer 7, the laser beam in order to create a combination of two polarisations of a first type;
separating the two polarisations of the first type by means of a source of dichroism 8;
converting, by means of the converter 9, the two polarisations of the first type at the output of the cell into two polarisations of a second type;
separating, by means of the separator 10, the two polarisations of the second type into two beams;
photodetecting the two separated beams and converting the photodetected beams into corresponding voltages, by means of photodetectors 11, 12; and
measuring the difference of said voltages by means of the calculator 13.

The separator 10 can be a separator cube formed by two right non-birefringent prisms and a polarising polymer film arranged between the two glued faces of the prisms. As such the separation of polarisations is provided by the polymer film which reflects one of the polarisations and transmits the other. Such prisms are clearly less expensive than prisms made from birefringent materials.

The quarter wave plate can be made from polymer or from quartz, with the quartz version having better thermal stability.

In the framework of the invention, the source of energy 4 in charge of energising the atoms of the cell 3 is configured to carry out the alternating of a first phase and of a second phase. More particularly, the first phase supplies more energy that the second phase.

The energy supplied during the first phase is such that the atoms are brought to the energised state (the metastable state $2^3S_1$ in the case of helium) wherein they are able to undergo said atomic transition when they are illuminated by the laser beam.

Such a modulation of the intensity of the energy supplied by the source of energy 4 therefore alternates a first phase wherein there is a high density of atoms in a state wherein they are able to undergo said atomic transition, and a second phase wherein there is a lesser density, even zero, of these atoms.

The high density of atoms obtained by the implementing of the first phase allows the laser light passing through the cell to be affected by the atoms in a manner that is sufficiently intense so that the modifications can be measured.

On the other hand, the low, even zero, intensity of the second phase makes it possible to measure the optical response of the atomic sensor. The knowledge of this optical response then makes it possible to overcome optical variations that are slow in relation to the speed of the modulation of the source of energy 4, such as for example variations linked to variations in temperature.

The frequency of the alternating between the first and the second phase of supplying energy is preferably at most 1 kHz. Note that the controlling of the wavelength of the semiconductor lasers is usually carried out on the Peltier module which controls their temperature (indeed the other control parameter of the laser, the current, induces, in addition to variations in the wavelength, substantial variations in the optical power which are not desirable). However the bandwidth of such a Peltier module is typically less than the Hz in such a way that the modulation of the supply of energy according to the invention does not introduce any loss of information.

The supplying of energy of the second phase can have a zero intensity. Alternatively, the supplying of energy of the second phase can have a non-zero intensity. This alternative can be advantageous when the modulation of the supplying of energy is carried out at a frequency such that the atoms energised during the first phase do not have the time to return to their fundamental state before they are again energised. In such a case, a modulation is then carried out which modifies the intensity of the supplying of energy, between an intense supplying during the first phase and a less intense supplying during the second phase.

In the framework of the invention, the calculator 13 is configured to calculate a DAVLL signal corresponding to the difference of the voltages delivered by the photodetectors devoid of slow optical variations. In order to eliminate these slow optical variations, for each one of the photodetectors 11, 12, the voltage measured by the photodetector during the second phase of supplying energy is subtracted from the voltage measured by the photodetector during the second phase of supplying energy.

The DAVLL signal can as such be written $(V_{1,Ph1}-V_{1,Ph2})-(V_{2,Ph1}-V_{2,Ph2})$, wherein:

$V_{1,Ph1}$ represents the voltage measured by the first photodetector 11 during the first phase of the supplying of energy;

$V_{1,Ph2}$ represents the voltage measured by the first photodetector 11 during the second phase of the supplying of energy;

$V_{2,Ph1}$ represents the voltage measured by a second photodetector 12 during the first phase of the supplying of energy; and $V_{2,Ph2}$ represents the voltage measured by the second photodetector 12 during the second phase of the supplying of energy.

This signal can also be standardised according to:

$$\frac{V_{1,Ph1}-V_{1,Ph2}}{V_{1,Ph2}}-\frac{V_{2,Ph1}-V_{2,Ph2}}{V_{2,Ph2}}.$$

And in a possible embodiment, the calculator 13 determines for the DAVLL signal the following standardised imbalance:

$$\frac{\frac{V_{1,Ph1}-V_{1,Ph2}}{V_{1,Ph2}}-\frac{V_{2,Ph1}-V_{2,Ph2}}{V_{2,Ph2}}}{\frac{V_{1,Ph1}-V_{1,Ph2}}{V_{1,Ph2}}+\frac{V_{2,Ph1}-V_{2,Ph2}}{V_{2,Ph2}}}$$

The calculation of this standardised imbalance has the advantage of making it possible to overcome the variations in intensity of the supplying of energy over several cycles of the modulation, as well as variations of intensity of the laser.

The DAVLL signal $S_{DAVLL}$ determined by the calculator 13 is supplied to a circuit for controlling 14 the wavelength of the laser which, according to the DAVLL error signal, can supply a setpoint voltage for the piezoelectric transducer 6 controlling the output mirror 5 of the laser or a current set point for the Peltier module.

When the source of dichroism 8 takes the form of a source of a magnetic field that can be controlled, such as is the case with the two alternatives mentioned hereinabove (coil passed through by a current and laser beam inducing a fictive magnetic field), the supplying of energy to the atoms of the atomic vapour can be modulated in order to include a third phase of supplying energy carried out in sequence with the first and second phases discussed hereinabove. The first and second phases operate with a magnetic field, generated by the source of dichroism, constant. During the third phase, this constant magnetic field is interrupted while a supplying of energy to the atoms of the atomic vapour is carried out, for example such as during the first phase, in order to have a high density of atoms in a state where they are able to undergo the atomic transition. This third phase makes it possible to revert to a conventional magnetometer architecture. In addition, during this third phase, the source of magnetic field can be used to create a radiofrequency magnetic field, which makes it possible to take a measurement of the magnetometry type. The controlling of the wavelength of the laser and an operational measuring of the magnetometry are therefore combined into a single system.

REFERENCES

[1] B. Chéron, H. Gilles, J. Hamel, O. Moreau, H. Sorel. Laser frequency stabilization using Zeeman effect. Journal de Physique III, EDP Sciences, 1994, 4 (2), pp. 401-406.
[2] U.S. Pat. No. 6,099,111
[3] J. M. Reeves, O. Garcia, C. A. Sackett. Temperature stability of a dichroic atomic vapor laser lock. Appl. Opt., AO, vol. 45, no. 2, pp. 372-376, 2006

The invention claimed is:

1. A method for controlling a wavelength of a laser on an atomic transition, comprising the steps consisting in:
  emitting a laser beam towards a cell filled with an atomic vapour;
  supplying energy to atoms of the atomic vapour using a source of energy;
  generating a DAVLL signal using the laser beam that has passed through the cell; and
  controlling the wavelength of the laser using the DAVLL signal;
  wherein the source of energy is modulated to carry out alternating of a first phase and of a second phase, the source of energy supplying more energy in the first phase than in the second phase.

2. The method according to claim 1, wherein the energy supplied during the first phase has an intensity such that the atoms are brought in an energised state in which they are able to undergo said atomic transition when they are illuminated by the laser beam.

3. The method according to one of claim 1, wherein in the second phase the source of energy does not supply energy.

4. The method according to claim 1, wherein generating a DAVLL signal using the laser beam that has passed through the cell comprises:
 polarising the laser beam in order to create a combination of two polarisations of a first type;
 separating the two polarisations of the first type by means of a source of dichroism;
 converting the two polarisations of the first type at an output of the cell into two polarisations of a second type;
 separating the two polarisations of the second type into two beams;
 photodetecting the two separated beams, converting the photodetected beams into corresponding voltages and measuring a difference of said voltages.

5. The method according to claim 4, wherein measuring of the difference of said voltages comprises calculating the following standardised imbalance:

$$\frac{\frac{V_{1,Ph1} - V_{1,Ph2}}{V_{1,Ph2}} - \frac{V_{2,Ph1} - V_{2,Ph2}}{V_{2,Ph2}}}{\frac{V_{1,Ph1} - V_{1,Ph2}}{V_{1,Ph2}} + \frac{V_{2,Ph1} - V_{2,Ph2}}{V_{2,Ph2}}}$$

wherein:
 $V_{1,Ph1}$ represents a voltage measured by a first photodetector during the first phase of the supplying of energy;
 $V_{1,Ph2}$ represents a voltage measured by the first photodetector during the second phase of the supplying of energy;
 $V_{2,Ph1}$ represents a voltage measured by a second photodetector during the first phase of the supplying of energy; and
 $V_{2,Ph2}$ represents a voltage measured by the second photodetector during the second phase of the supplying of energy.

6. The method according to claim 4, wherein the source of dichroism is a source of magnetic field.

7. The method according to claim 6, wherein the source of magnetic field comprises one or several magnets arranged around the cell.

8. The method according to claim 6, wherein the source of magnetic field comprises a coil arranged around the cell, said coil being passed through by a constant current.

9. The method according to claim 6, wherein the source of magnetic field is a fictive magnetic field induced by an AC-Stark shift.

10. The method according to claim 8, wherein the source of energy is modulated to carry out a third phase in sequence with the first and second phases, an intensity of the energy supplied during the third phase being identical to an intensity supplied during the first phase and the source of magnetic field being interrupted during the third phase.

11. The method according to claim 1, wherein the cell contains helium, the atomic transition corresponds to a line $D_0$ and the energy supplied during the first phase has an intensity such that the atoms of helium are brought to a metastable state $2^3S_1$.

12. The method according to claim 1, wherein the source of energy is a source of HF discharge.

13. The method according to claim 1, wherein the source of energy is a source of thermal energy.

14. The method according to claim 1, wherein a frequency of the alternating between the first and the second phase is at most 1 kHz.

15. An optical measuring system, comprising:
 a cell filled with an atomic vapour and arranged to receive a laser beam emitted by a laser;
 a source of energy for carrying out a supply of energy to atoms of the atomic vapour;
 a polarimetric optical assembly configured for generating a DAVLL signal using the laser beam that has passed through the cell; and
 a circuit for controlling a wavelength of the laser on an atomic transition using the DAVLL signal;
wherein the source of energy is configured to carry out alternating of a first phase and of a second phase, the first phase supplying more energy than the second phase.

* * * * *